United States Patent [19]
Chen

[11] Patent Number: 5,822,242
[45] Date of Patent: Oct. 13, 1998

[54] ASYMMETRIC VIRTUAL GROUND P-CHANNEL FLASH CELL WITH LATID N-TYPE POCKET AND METHOD OF FABRICATION THEREFOR

[75] Inventor: Chia-Shing Chen, Hsing Chu, Taiwan

[73] Assignee: Macronix International Co, Ltd., Hsinchu, Taiwan

[21] Appl. No.: 812,107

[22] Filed: Mar. 5, 1997

[51] Int. Cl.$^6$ .................................................. G11C 13/00
[52] U.S. Cl. .................................. 365/185.01; 365/185.1
[58] Field of Search ........................... 365/185.01, 185.1, 365/185.05, 185.11

[56] References Cited

U.S. PATENT DOCUMENTS 5,452,250  9/1995  Riggio, Jr. .......................... 365/185.01

*Primary Examiner*—Terrell W. Fears
*Attorney, Agent, or Firm*—Wilson, Sonsini, Goodrich & Rosati; Mark A. Haynes; Charles C. Cary

[57] ABSTRACT

A memory cell having an asymmetric source and drain connection to virtual ground bit-lines providing an abrupt junction suitable for band-to-band hot electron generation and a gradual junction suitable for Fowler-Nordheim tunneling on each side of the cells. A nonvolatile semiconductor memory device comprising row and column arrangement of the cells in which adjacent columns of cells share a single virtual ground bit line. The method for manufacturing a memory cell having asymmetric source and drain regions and comprising the steps of: (1) forming a semiconductor substrate having a first conductivity type; (3) forming a dielectric covering a semiconductor substrate; (3) forming a first and second column of floating gate cores on the dielectric; (4) implanting a first dopant along a first dopant strip, the first dopant strip aligned between the first and second column and having a second conductivity type opposite the first conductivity type; (5) implanting a second dopant in a second dopant strip aligned with the first diffusion and extending below the second column, the second dopant having an enhancement of the first conductivity type; and (6) completing formation of control gate dielectric and control gates. The presence of asymmetric source and drain diffusions formed thereby improve the isolation between adjacent memory cells and minimizes the disturb problem.

9 Claims, 9 Drawing Sheets

ASYMMETRIC VIRTUAL GROUND P-CHANNEL FLASH CELL WITH LATID N-TYPE POCKET AND METHOD OF FABRICATION THEREFOR

RELATED APPLICATION DATA

This present application is related to An Asymmetric Flash EEPROM With A Pocket To Focus Electron Injection And A Manufacturing Method Therefor, Ser. No. 08/812,104, Attorney Docket No. 17538.860, filed on Mar. 5, 1997, which is incorporated by reference as if fully set forth herein.

BACKGROUND OF THE INVENTION

1. Field of the Invention

The field of the present invention relates to a nonvolatile semiconductor memory device and a manufacturing method therefor, and more particularly to an electrically programmable nonvolatile metal-oxide-semiconductor (MOS) memory device having an asymmetric source and drain and a manufacturing method therefor.

2. Description of Related Art

Flash memories are a growing class of nonvolatile storage integrated circuits. Flash memories have the capability of electrically erasing, programming, and reading a memory cell in the chip. A flash memory cell is formed using so-called floating gate transistors in which the data are stored in a cell by charging or discharging the floating gate. The floating gates are a conductive material, typically polysilicon, which is insulated from the channel of the transistor by a thin layer of oxide, or other insulating material. The floating gates are also insulated from the control gate/wordline of the transistor by a second layer of insulating material.

Data is stored in the memory cell by charging or discharging the floating gate. The floating gate is charged by either tunneling or injection of electrons through a thin dielectric separating the floating gate from the substrate. Fowler-Nordheim (FN) tunneling of electrons occurs when a large positive voltage is established between the floating gate and source or drain. The resultant high electric field imparts sufficient potential energy to electrons to allow them to surmount the energy barrier presented by the thin dielectric and tunnel into the floating gate. Alternatively, an injection mechanism may be used. Avalanche injection relies on an electric field of lesser magnitude than that required for FN tunneling. In avalanche injection, carrier-to-carrier collisions impart kinetic energy to electrons, which when coupled with the potential energy, is sufficient to allow them to surmount the energy barrier created by the thin dielectric. When the floating gate is charged, the threshold voltage for causing the memory cell channel to conduct is increased above the voltage applied to the word-line during a read operation. Thus, when a charged cell is addressed during a read operation, the cell does not conduct. The non-conducting state of the cell can be interpreted as a binary 1 or 0 depending on the polarity of the sensing circuitry.

The floating gate is discharged to establish the opposite memory state. This function is typically carried out by a FN tunneling mechanism between the floating gate and the source or the drain of the transistor, or between the floating gate and the substrate. For instance, the floating gate may be discharged through the source by establishing a large positive voltage from the source to the gate, while the drain is left at a floating potential.

Recently a second injection mechanism has been identified for use in programming of floating gate transistors. As set forth by Sakamoto et. al., A High Programming Throughput 0.35 um p-channel DINOR Flash Memory, VLSI Technology Digest, p.222, 1996, a band-to-band hot electron injection mechanism can be utilized for programming floating gates. Traditionally, band-to-band mechanisms have been associated with detrimental device characteristics such as: leakage current, word-line disturb and degradation of the insulating property of the tunneling oxide. These detrimental characteristics can be attributed to the attraction and trapping of hot holes (as opposed to hot electrons) in the thin dielectric during programming of n-channel devices. Holes are less mobile than electrons and more likely to get trapped in the dielectric. As Messrs. Sakamoto et. al., point out, it is only during programming of a n-channel device where negative voltages are applied to the control gate that hot holes are attracted to the floating gate. In a p-channel device, a positive programming voltage is applied to the control gate and hot holes are repelled from the floating gate and electrons are attracted. The cell utilized by Sakamoto et. al., is programmed by band-to-band hot electron injection (BBHE) and erased by channel FN tunneling. The symmetric cell structure is utilized in a Divided Nor (DINOR) architecture in which the source side of each column of memory cells is connected to a sub bit-line. The drain of each column of cells is connected to a separate bit-line from the source.

A trend in the industry to improve the packing density of a memory array, is to utilize a virtual ground architecture, rather than that disclosed by Messrs. Sakamoto et al. In a virtual ground architecture, the transistors of adjacent memory cell columns share a bit-line between the source and the drain of the transistors in adjacent columns. The need for a dedicated pair of bit-lines per column is eliminated. Any memory cell in the array can be programmed, or read by the application of appropriate voltages to the word-line and the bit-lines connected to it. In particular, the state of an addressed memory cell can be determined by sensing the current flowing through its source and drain by means of the bit lines connected thereto.

The major challenge of implementing a flash memory design utilizing a virtual ground architecture is to maintain disturb resistance. Disturb refers to the unacceptable alteration of the memory logic state on a cell sharing a bit-line and word-line with a cell being programmed or erased.

To realize further reductions in array size, it would be desirable to find a method for implementing BBHE in a virtual ground architecture.

SUMMARY OF THE INVENTION

The present invention provides a nonvolatile semiconductor memory device and a manufacturing method therefor. A memory cell is disclosed in which programming by band-to-band hot electron injection (BBHE) and erasing by FN tunneling is accomplished. The BBHE programming operation consumes less power and occurs faster than is possible with FN programming. The memory cell has source and drain regions in a semiconductor substrate which are aligned with a floating gate core above the semiconductor substrate. On the drain side of the cell, an abrupt junction formed by a $n^-$ pocket and a $p^+$ buried bit-line diffusion enhances band bending and hence electron/hole pair generation by band-to-band tunneling. Electrons generated in the abrupt junction are attracted to the floating gate core by the large electric field present during the programming of the cell and a number of the electrons are sufficiently energized to inject into the floating gate thereby programming the cell. On the source side of the cell, a gradual junction formed by a p⁻ pocket and a p⁺ buried bit-line diffusion suppresses electron/hole pair generation while allowing erasure by FN tunneling. The memory is capable of affecting the programming, erasing and read operations of a memory cell while reducing disturbance of a cell adjacent to the one being programmed, erased or read.

In order to achieve the foregoing memory, a semiconductor substrate of a first conductivity type is provided. A dielectric is provided on the semiconductor substrate. A floating gate core is provided on the dielectric. The floating gate core has opposing first and second sides. A first diffusion region is aligned horizontally with the first side of the floating gate core. A second diffusion region is aligned horizontally with the second side of the floating gate core. Both the first and second diffusion regions are characterized by a second conductivity type opposite the first conductivity type and both the first and second diffusion regions extend vertically into the semiconductor substrate. A third diffusion region is aligned horizontally with the first side of the floating gate core. The third diffusion region extends horizontally toward the second side of the floating gate core. The third diffusion region has the first conductivity type and is more conductive than the substrate. The third and first diffusion regions form an abrupt junction below the floating gate core suitable for BBHE.

In another embodiment of the invention, a plurality of virtual ground bit-lines each link adjacent columns of memory cells in a memory array laid out as rows and columns of memory cells. Each memory cell comprises a single floating gate transistor. Each transistor includes a floating gate core which is formed on a dielectric tunneling layer on a semiconductor substrate. The semiconductor substrate has a first conductivity type. Adjacent columns of memory cells share a virtual ground bit-line between the sources of one and the drains of the other of the adjacent columns. Each of the plurality of bit-lines is formed from a plurality of first diffusions regions buried beneath the tunneling dielectric in the substrate. The plurality of first diffusion regions are aligned between a first and second adjacent columns of floating gate cores. The plurality of first diffusion regions are characterized by a second conductivity type opposite the first conductivity type. A plurality of second diffusion regions are each aligned with a corresponding one of the plurality of first diffusion regions and extend horizontally below the second column of floating gate cores. The plurality of second diffusion regions have the first conductivity type and are more conductive than the semiconductor substrate. The plurality of second diffusion regions form a junction with each of the plurality of first diffusion regions below the second column of floating gate cores. A plurality of word-line conductors cover each row of floating gates in a direction perpendicular to the buried diffusion bit-lines. Each floating gate of a memory cell has a gate of polycrystalline silicon joined with the gate of an adjacent transistor in a row to form a word-line arranged in a direction perpendicular to the buried diffusion layers. The word-line conductor is separated from the floating gate cores by a dielectric layer. A row select circuit is connected to the plurality of word-lines. A column select circuit and sense amplifier are connected to the plurality of first and second diffusion regions. The selection circuitry gates current to a word-line and a selected pair of the plurality of first and second diffusion regions to program, erase, and read a selected floating gate transistor.

Further, a manufacturing method for the above-mentioned nonvolatile semiconductor memory device according to this invention comprises the steps of:

forming a semiconductor substrate having a first conductivity type;

forming a dielectric covering the semiconductor substrate;

forming a first and a second column of floating gate on the dielectric;

implanting a first dopant having a second conductivity type opposite the first conductivity type along a first dopant strip, the first dopant strip aligned between the first and second columns;

implanting a second dopant in a second dopant strip aligned with the first dopant strip and extending horizontally below the second column, the second dopant having the first conductivity type and having greater conductivity than the semiconductor substrate and forming a junction with the first dopant below the second column; and completing formation of control gate dielectric and control gates.

The manufacturing method of the present invention results in a junction which maximizes band bending and, therefore, electron/hole pair generation by band bending on only one side of each memory cell. This arrangement makes the cell resistant to a disturb condition resulting from the programming of a memory cell which shares a word-line and bit-line.

Other aspects and advantages of the present invention can be seen upon review of the figures, the detailed description, and the claims which follow.

DETAILED DESCRIPTION OF PREFERRED EMBODIMENTS

A detailed description of the preferred embodiments of the present invention is provided with respect to the figures. A p-channel transistor is disclosed which is suitable for use in a floating gate memory array. The transistor has an asymmetric diffusion pocket on the source and drain sides of the channel. The pocket on the drain side creates an abrupt junction which enhances band bending and therefore maximizes electron/hole pair generation. Since the transistor has a p-channel, a positive gate voltage can be utilized during programming. The positive gate voltage repels hot holes, thereby preventing degradation of the transistor, and attracts electrons, to the floating gate. The pocket on the source side minimizes band bending and therefore, minimizes band-to-band electron/hole pair generation. The asymmetric layout of the p-channel transistor allows BBHE programming on the drain side and FN erasure to the channel of the cell. The asymmetric layout of the p-channel transistor also allows for utilization in virtual ground memory architectures in which adjacent cells share a source and drain with a single bit-line.

Figure 1:
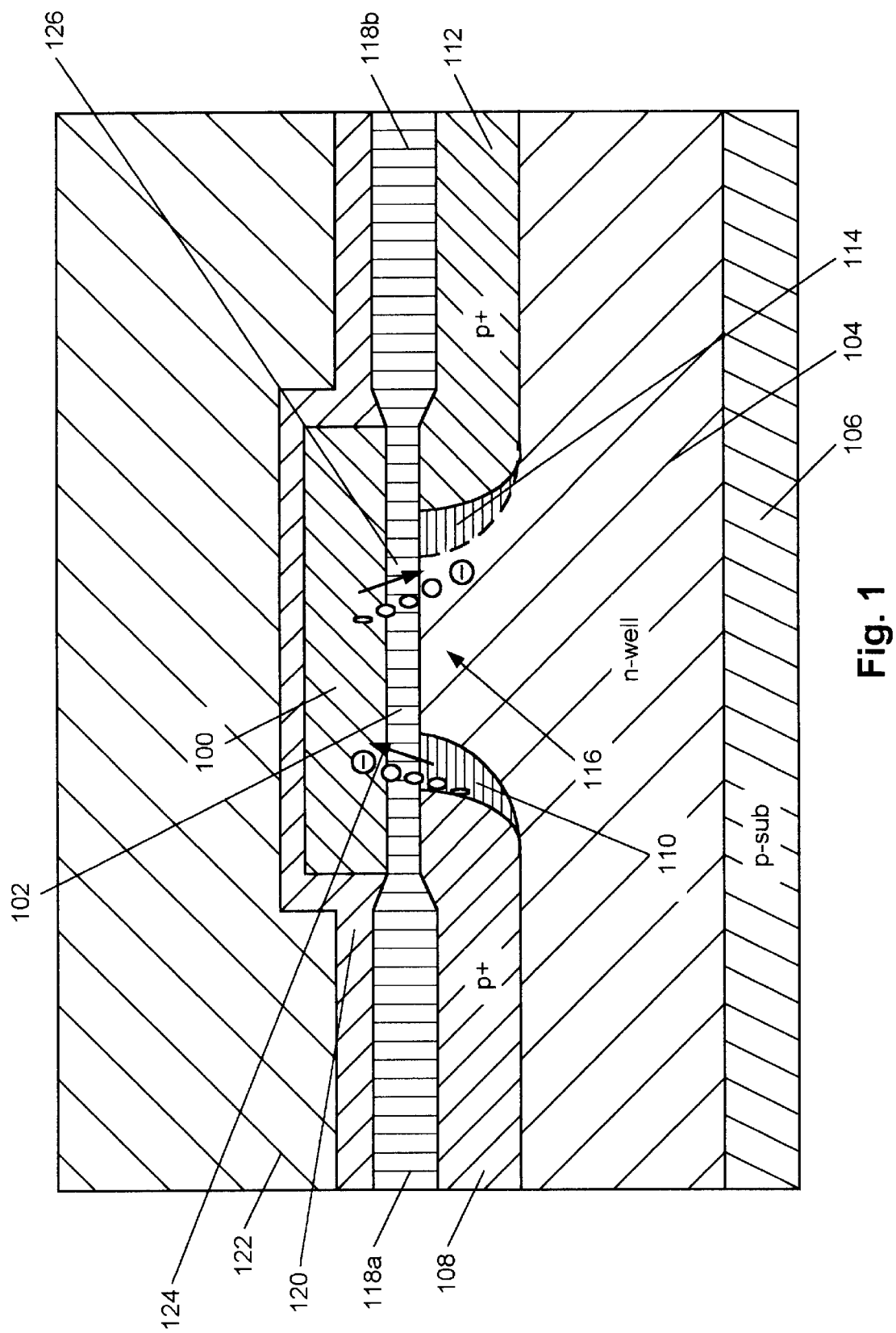
FIG. 1 is a partial cross-section elevation view of a p-channel floating gate transistor according to the current invention.

FIG. 1 is a partial cross-section elevation view of a p-channel floating gate transistor. A floating gate core 100 is separated from a n-type well 104 by a tunneling dielectric 102. The n-type well is formed on a p-type substrate 106. A drain junction is formed by buried p+ drain diffusion 108 and buried drain n− pocket 110. A gradual source junction is formed by buried p+ source diffusion 112 and p− buried source pocket 114. A p-type channel region 116 is defined between the abrupt drain and gradual source junctions. The buried p+ drain diffusions 108 and 112 are covered by field oxide 118a–b, respectively. The field oxide and floating gate core are separated from a control gate 122 by an interpoly dielectric 120. This symmetry could be reversed with the result that the source would have an abrupt junction and the drain a gradual junction.

The programming 124 of the transistor is accomplished by band-to-band hot electron injection (BBHE) on the drain side of the transistor. The buried drain n-pocket 110 enhances bend bending and hence hot electron generation. To program the cell, a positive voltage, e.g. +10 volt, is applied to the control gate 122; a negative voltage, e.g. −6 volt, is applied to the buried drain diffusion 108 while the buried p+ source diffusion 112 is allowed to float. Under these conditions electrons will tunnel from the valence band to the conduction band. When the valence band electrons tunnel into the conduction band free holes are left in the valence band. These holes, would in a n-channel device be accelerated toward the gate by a negative programming voltage and would become trapped in the tunneling dielectric 102, thereby degrading device performance and reliability. However, because the transistor is p-channel, a positive programming voltage is applied to the control gate 122 and attracts electrons to the floating gate. The electrons are accelerated in the strong vertical electric field between the drain diffusion 108 and the control gate 122 and a number of them become energized "hot" electrons with sufficient energy to be injected through the tunneling dielectric 102 into the floating gate core 100. The holes are attracted to the drain diffusion 108 where many holes exist.

A state of erasure 126 is accomplished by FN tunneling from the floating gate core 100 to the buried p+ source diffusion 112. When the transistor is being erased a negative voltage, e.g. −10 volt, will be applied to control gate 122, a positive voltage, e.g. +10 volts, will be applied to the source diffusion 112 and the drain will be floating. Under these conditions a forward bias will be imposed on the source diffusion and the n-well 104 and the n-well will be positively charged. As a result FN tunneling erasure 126 of electrons from the floating gate core 100 to the channel 116 will take place. The presence of p− buried source pocket 114 will reduce band bending to a level below the silicon band gap. Thus, during erasure generation of electron/hole pairs is suppressed by the gradual source junction.

The read operation is accomplished by applying a negative voltage, e.g. −1 volt to the drain diffusion 108, a negative voltage, e.g. −3.3 volts, to the control gate, and with the source at 0 volts. When the floating gate is charged, the threshold voltage for causing the p-channel transistor to conduct is decreased below the voltage applied to the control gate during a read operation. Thus, a charged transistor will conduct during a read operation and an uncharged transistor will not conduct. The non-conducting state of the cell can be interpreted as a binary 1 or 0 depending on the polarity of the sensing circuitry.

Array Architecture

Figure 2:
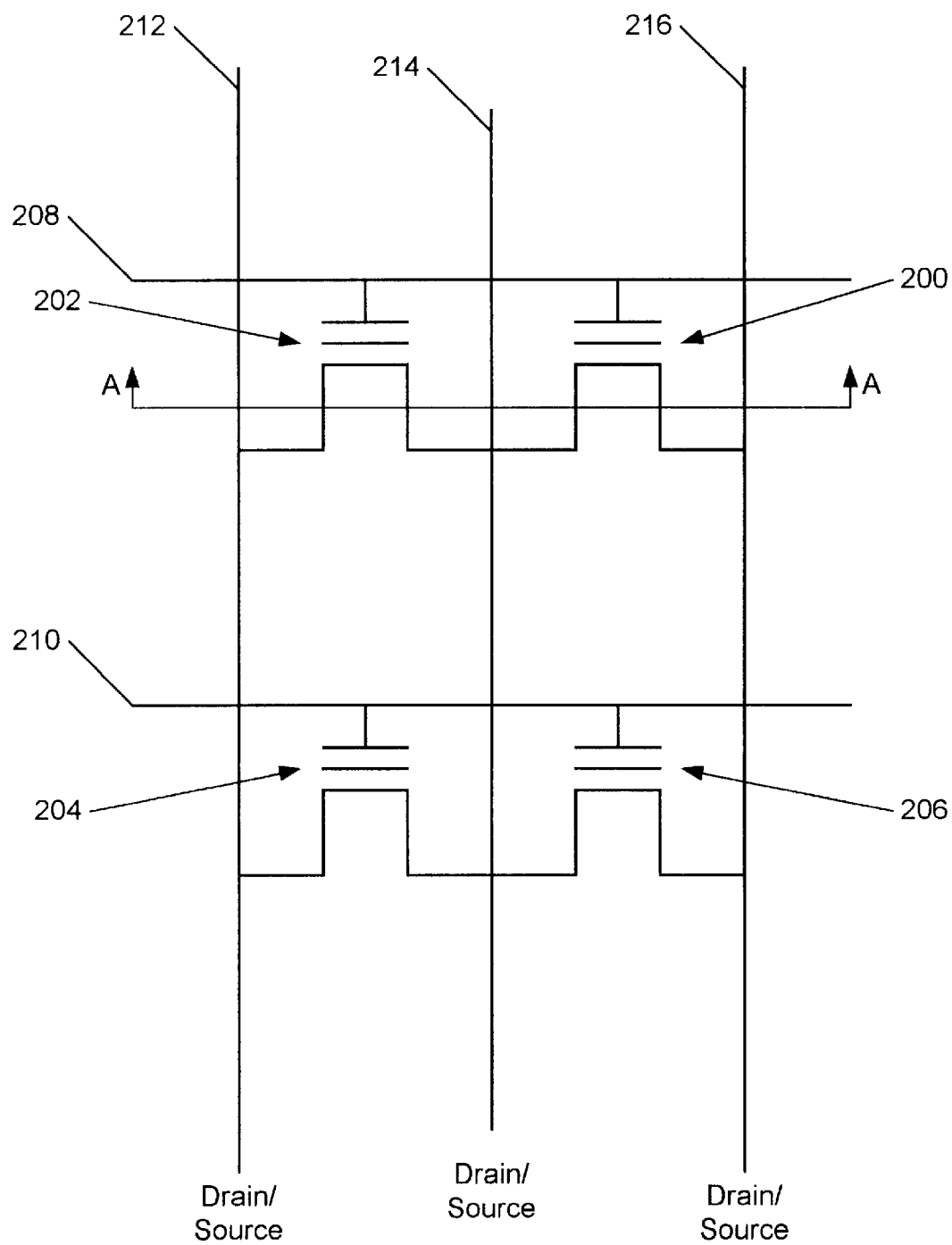
FIG. 2 is a schematic view of a non-volatile memory array with a p-channel memory cell according to the current invention.

FIG. 2 is a schematic illustration of a memory device utilizing the p-channel transistor of the current invention. A two-dimensional array of memory cells is formed by arranging floating gate transistors 200–206 into rows and columns. A right column comprises transistors 200 and 206. A left column comprises transistors 202 and 204. The first row of the array comprises transistors 202 and 200. The second row of the array comprises transistors 204 and 206. The sources of transistors 200 and 206 are connected to buried bit-line 216. The drains of transistors 200 and 206 and the sources of transistors 202 and 204 are connected to buried bit-line 214. The drains of transistors 202 and 204 are connected to buried bit-line 212. The gates of transistors 200 and 202 are connected to word-line 208. The gates of transistors 204 and 206 are connected to word-line 210.

An X-Y addressing system is affected by word-lines 208 and 210 and the rows of memory cells they select on an X-axis and the bit-lines 212–216 and the columns of memory cells on a Y-axis. When a memory cell such as 202 is addressed, appropriate voltages must be passed on to its drain and source by the bit-lines 212 and 214, respectively, and to its control gate via word-line 208. In this manner, any cell in the array can be addressed individually for programming, erasure and read operations.

The p-channel flash EEPROM transistor of the current invention is particularly advantageous in a memory array for a number of reasons. For example, by utilizing a BBHE programming mechanism the device is able to achieve a higher programming speed and lower power consumption than is possible with FN programming. These characteristics are a result of the drain junction and the p-channel cell layout. The drain junction maximizes electron/hole pair generation, and the p-channel layout assures that electrons rather than holes are attracted to the floating gate. Power consumption is low, because band-to-band current, which in n-channel devices is associated with leakage current, is in this p-channel device used instead for programming. A second advantage is that the asymmetric source/drain structure serve to isolate and minimize the disturb condition in a cell sharing a bit-line and a word-line with an adjacent cell which is being programmed or erased. As shown in FIG. 1, each p-channel transistor is configured so that band-to-band electron/hole pair generation takes place only at the drain side and, thereby, prevents a disturb condition on a cell adjacent to one being programmed or erased. The cell structure is most advantageously used in compact memory architectures, such as the buried virtual ground arrangement shown in FIG. 2. In a buried virtual ground arrangement, adjacent cells share a buried bit-line with a source of one and a drain of the other cell. The asymmetric p-channel transistor and method for fabricating the same which are disclosed in this application may be used in a common ground architecture in which adjacent cells share a bit-line between either their sources or drains.

Gate Disturb

In the virtual ground architecture, such as that shown in FIG. 2, the disturb problem that arises is called a gate disturb. The terminology "gate disturb" refers to an increase in floating gate charge and hence possible corruption of the bit stored in memory, resulting from programming of a cell sharing a word-line and bit-line with the programmed cell. For example, when a transistor 200 is to be programmed, a positive voltage is placed on word-line 208. Bit-line 214 which is connected to the drain of transistor 200 is placed at a negative voltage and bit-lines 212 and 216 are floating. Under these conditions, electrons are attracted to the floating gate of transistor 200 from the bit-line 214. The control gate of transistor 202 and transistor 200 are both connected to word-line 208. Therefore, during the programming of transistor 200 the control gate of transistor 202 is also placed in a positive voltage condition. In addition, the source of transistor 202 is connected to bit-line 214 and is therefore placed in a negative voltage condition. If the source of transistor 202 generates electron/hole pairs then the hot electrons will be injected into its floating gate during the programming of memory cell 200. If sufficient charge is added to the floating gate of transistor 202 to alter the logic state corresponding to the amount of charge stored on transistor 202, due to a gate disturb condition, then an error occurs. However, due to the drain junction which maximizes electron/hole generation and the source junction which minimizes electron/hole pair generation the present cell structure reduces the gate disturb problem.

Manufacturing Steps for a p-Channel Transistor

FIGS. 4–8 are cross-sectional views taken at FIG. 2(A—A) of a preferred embodiment for the manufacturing steps of an asymmetric p-channel transistor. The manufacturing techniques result in a cell which has an abrupt junction suitable for generation of electron/hole pairs by band-to-band tunneling on one of the source or drain sides of the cell. On the other side of the cell, a gradual junction inhibits electron/hole pair generation. The cell produced by this process has a high programming speed, lower power consumption and is resistant to a disturb condition.

Figure 3:
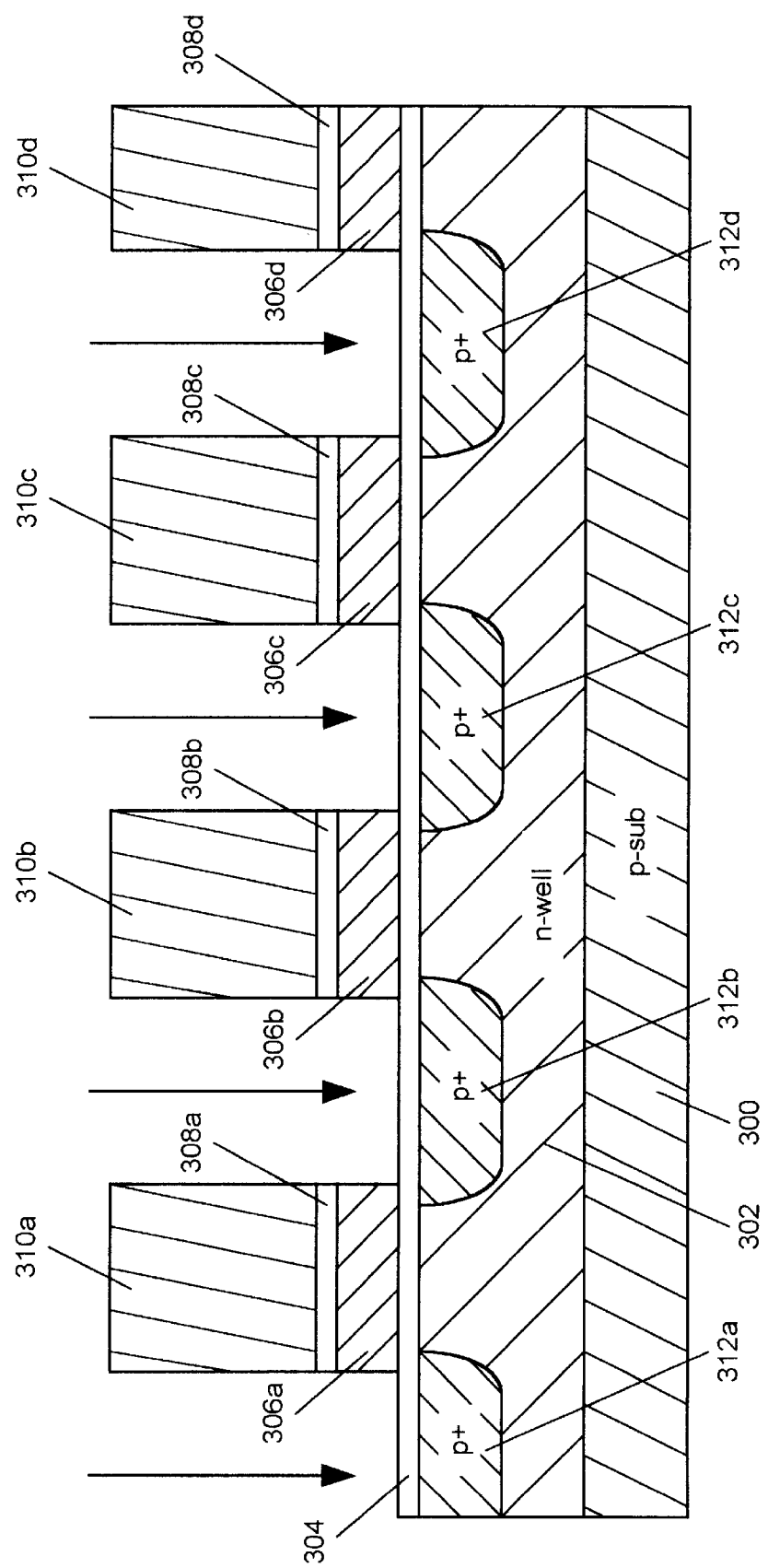
FIGS. 3–8 are partial cross-sectional elevation views taken at FIG. 2(A—A) and illustrating the steps in manufacturing a p-channel memory cell.

The cell is fabricated using a sub-micron CMOS triple metal, double well (one well in the array, and a second well for the peripheral circuitry), double poly and one layer polycide technology. FIG. 3 illustrates the initial formation steps. After formation of a n-well 302 in p-substrate 300, a tunneling oxide 304 is formed on the surface of the n-well. Next a polysilicon layer is deposited on the tunneling oxide. Then a silicon nitride layer is deposited on the polysilicon. The structure is masked and patterned to define polysilicon floating gate strips 306a–d and respective silicon nitride caps 308a–d. Then, photo-resist masks 310a–d are placed over nitride caps 308a–d, respectively. Next an implant/diffusion of a p-type dopant, e.g., boron, at a right angle to the substrate surface is used to form buried p$^+$ diffusions 312a–d. The p$^+$ diffusions, within the n-well 302, are aligned between the floating gate cores. Buried p$^+$ diffusion 312b is aligned between floating gate cores 306a–b. Buried p$^+$ diffusion 312c is aligned between floating gate cores 306b–c. Buried p$^+$ diffusion 312d is aligned between floating gate cores 306c–d.

Figure 4A:
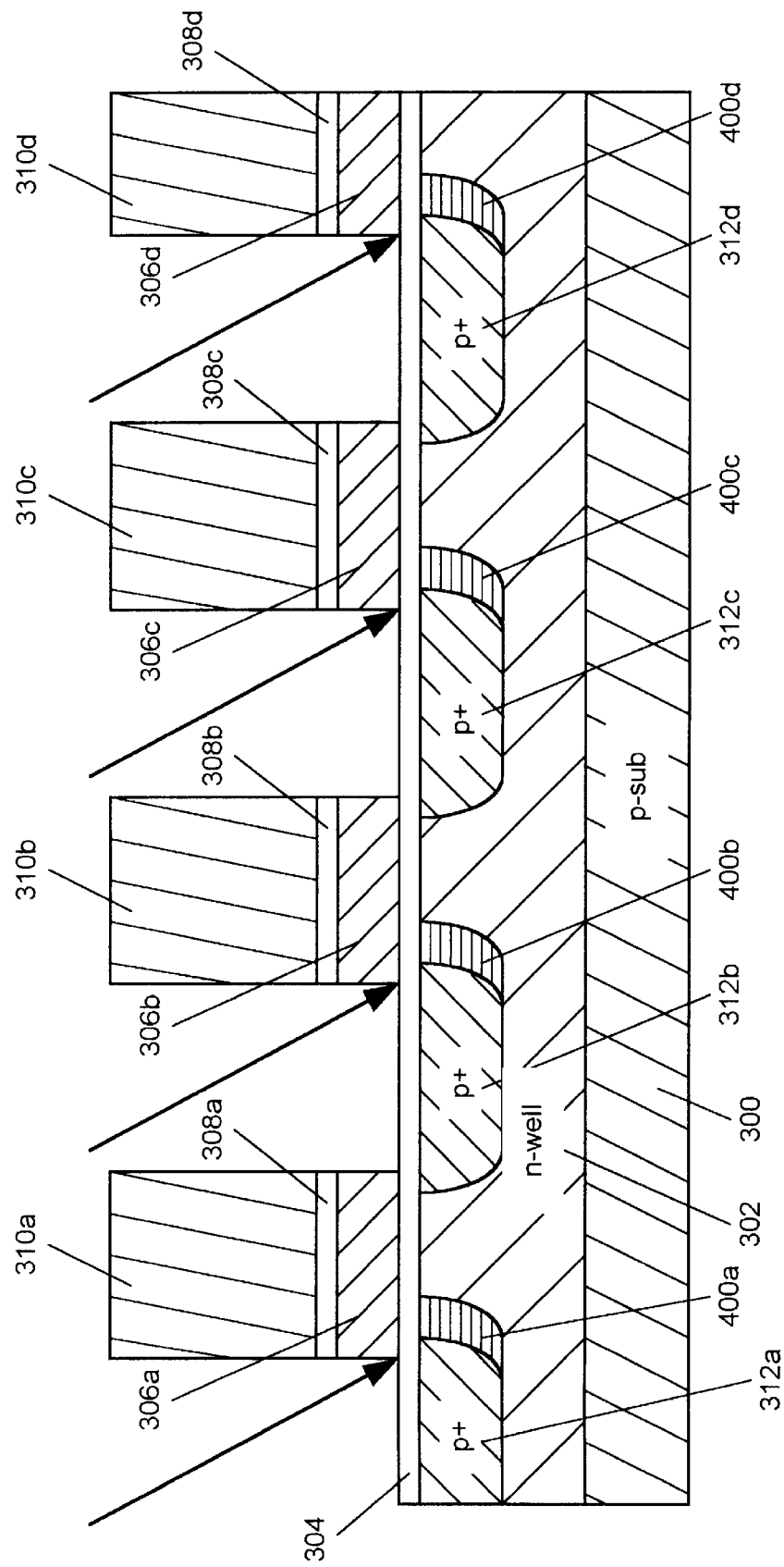
Figure 4B:
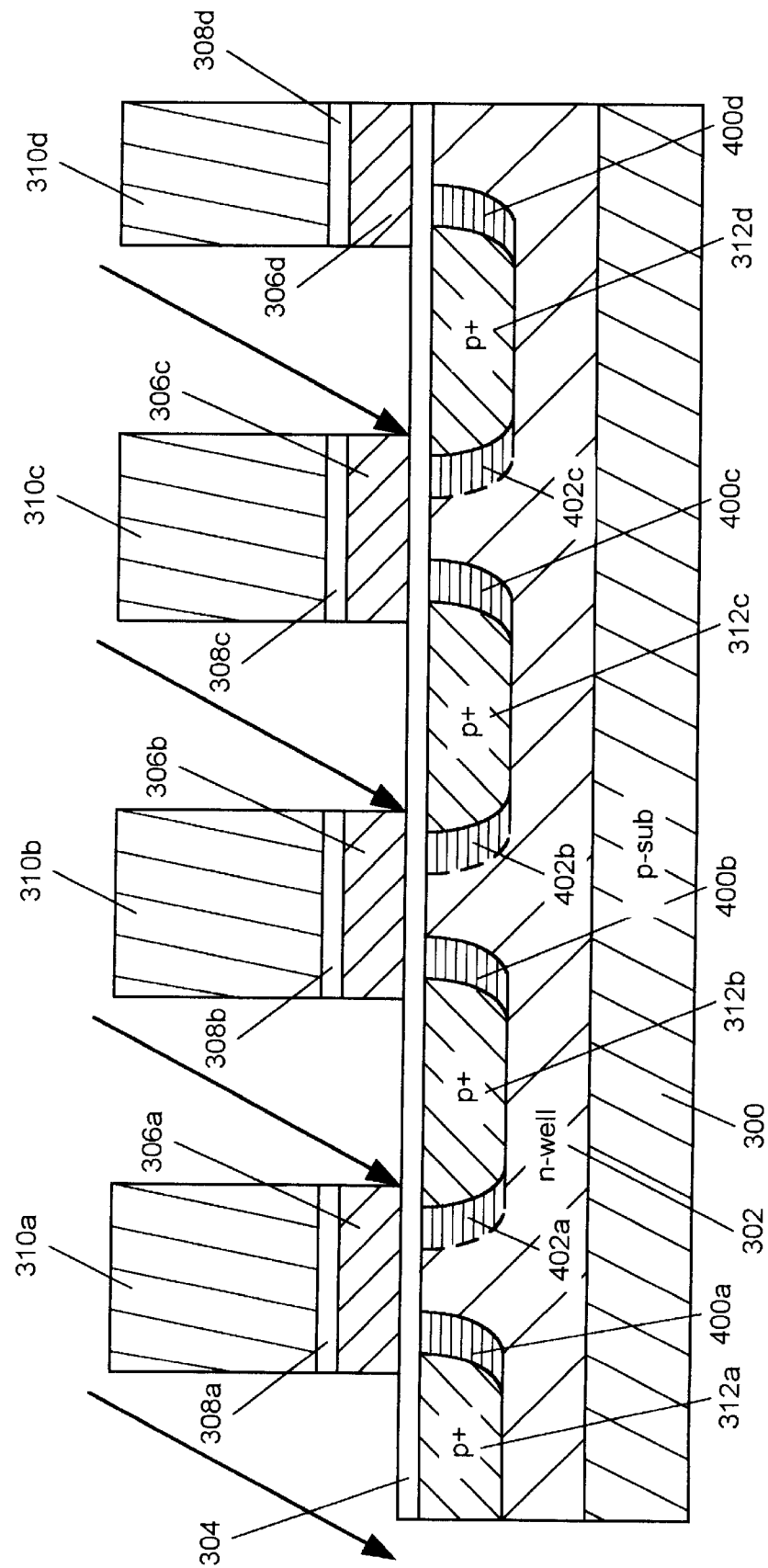

FIGS. 4A–B show the formation process for the abrupt drain and gradual source junctions of the p-channel cell. The formation involves a Large Angle Tilt Implant Diffusion (LATID) ion implantation process. In FIG. 4A, LATID implantation of a n$^-$ pocket on the drain side of floating gate cores 306a–d is shown. The arsenic ion is a preferred ion for the n$^-$ implant. The angle of an implant depends on device geometry and may range from 30 to 75 degrees of tilt. The LATID implant produces buried n$^-$ pockets 400a–d adjacent buried p$^+$ diffusions 312a–d, respectively. The buried drain n$^-$ pockets enhance by 2V or more the junction breakdown voltage of the buried p$^+$ diffusions 312a–d on the drain side of the cells. The junction formed between the n$^-$ pockets and the p$^+$ diffusions causes band bending which exceeds the silicon bandgap. The increase in the drain to substrate junction breakdown voltage correlates to an improvement in band bending between the drain and the channel. Increased bend bending, in excess of the silicon bandgap results in more efficient electron/hole pair generation on the drain side of the cell during programming.

In FIG. 4B, the LATID process is used to form a gradual junction on the source side of each cell. A LATID implantation of a p$^-$ pocket on the source side of floating gate cores 306a–c is shown. The boron ion is preferred for the p$^-$ implant. The angle of an implant depends on device geometry and may range from 30 to 75 degrees of tilt. The LATID implant produces buried p$^-$ pockets 402a–c adjacent buried p$^+$ diffusions 312b–d, respectively. The junction formed between the p$^-$ pockets and the p$^+$ diffusion reduces band bending to levels below the silicon bandgap. This reduces the probability of electron/hole pair generation on the source side of the cell during programming and thus, minimizes the above-discussed gate disturb problem.

Figure 5:
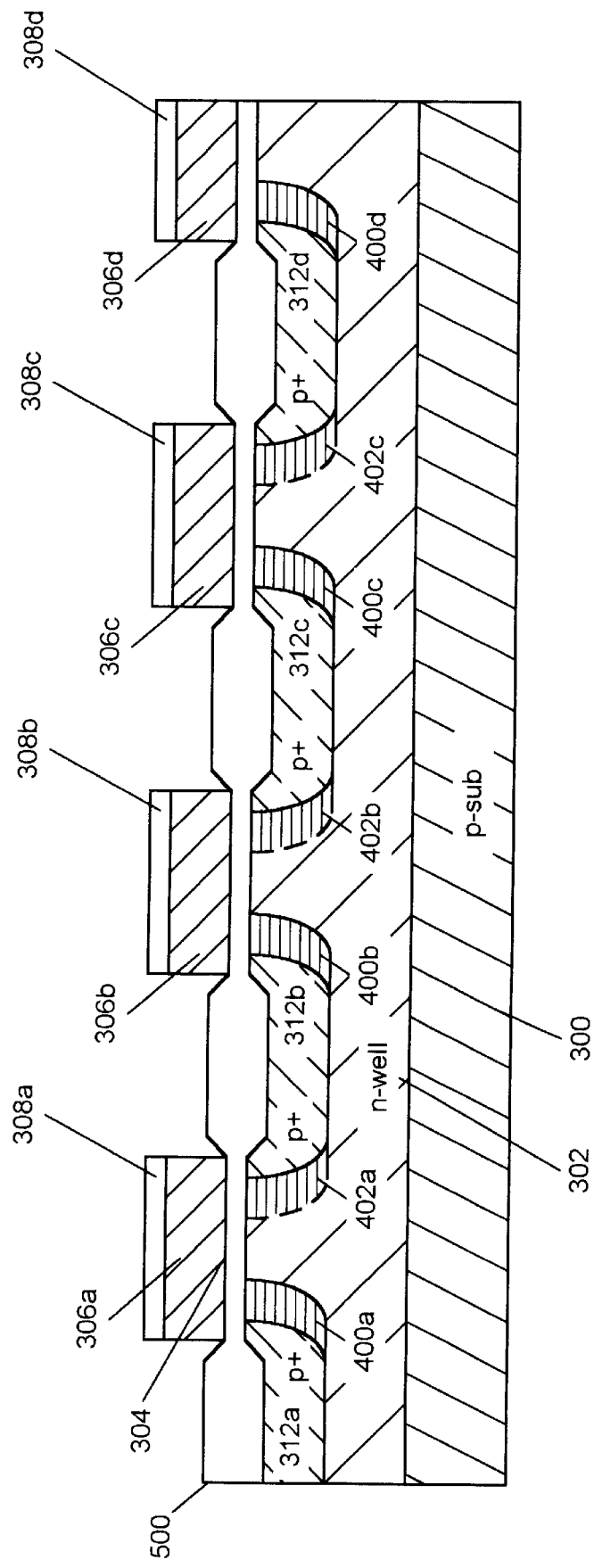
Figure 6:
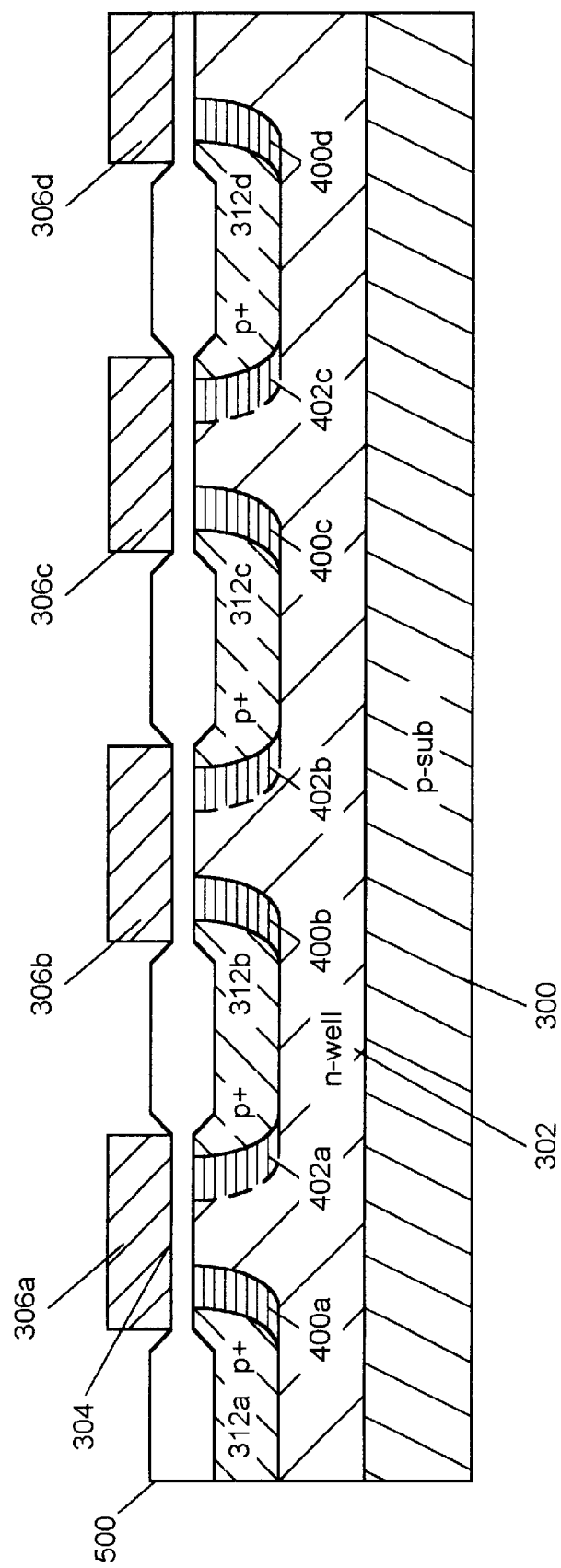

In FIG. 5, the photo-resist masks 310a–d have been removed. Then field oxide regions are grown over buried p$^+$ diffusions 312a–d. As referenced in FIG. 5 field oxide 500 is grown over buried p$^+$ diffusion 312a. As shown in FIG. 6, the nitride caps 308a–d are removed.

Figure 7:
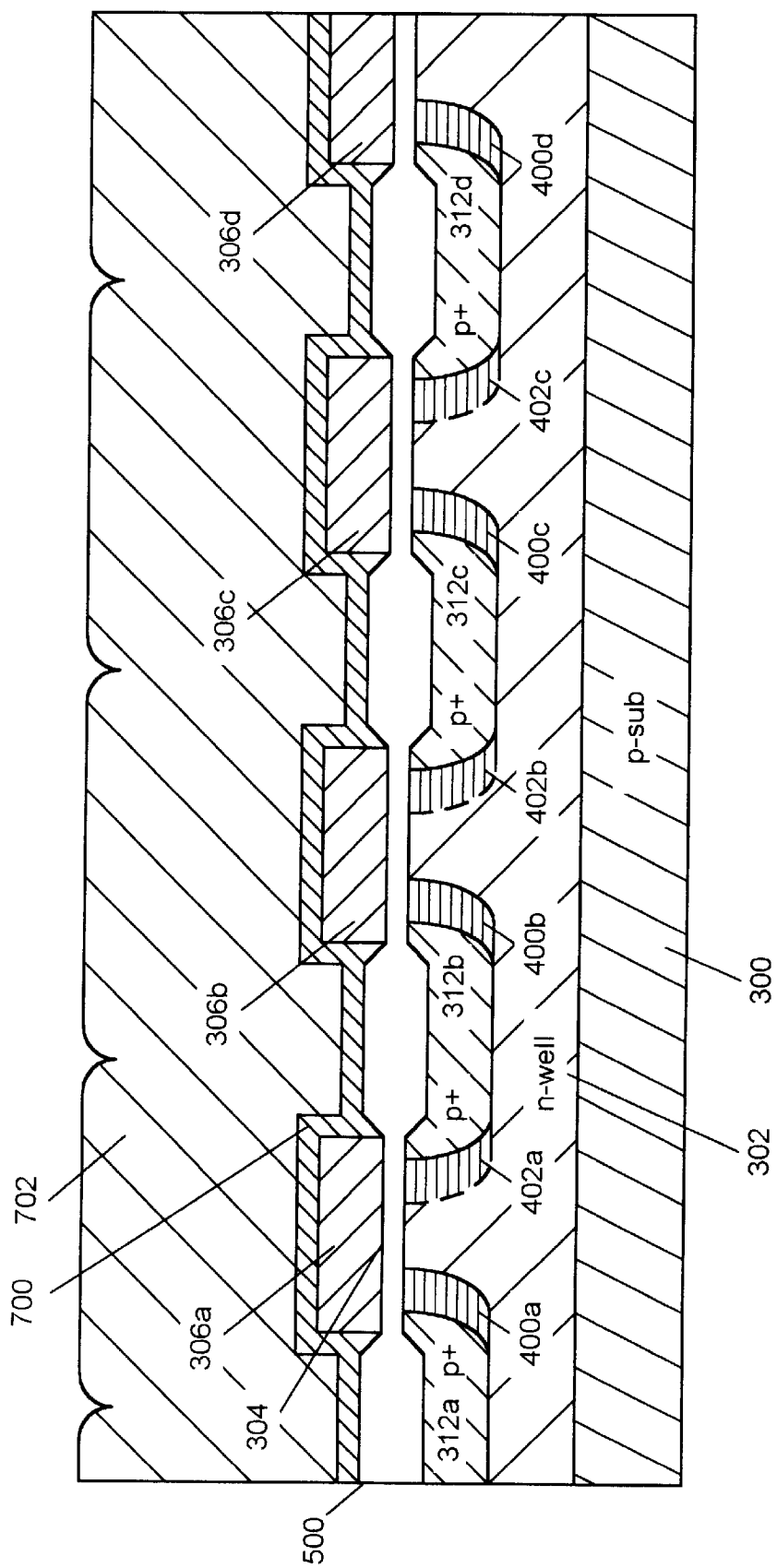

In FIG. 7, an interpoly dielectric 700, e.g., oxide-nitride-oxide (ONO), is deposited over floating gate cores 308a–d and field oxide regions between the floating gate cores. A polysilicon layer 702 is formed over the interpoly dielectric.

Figure 8:
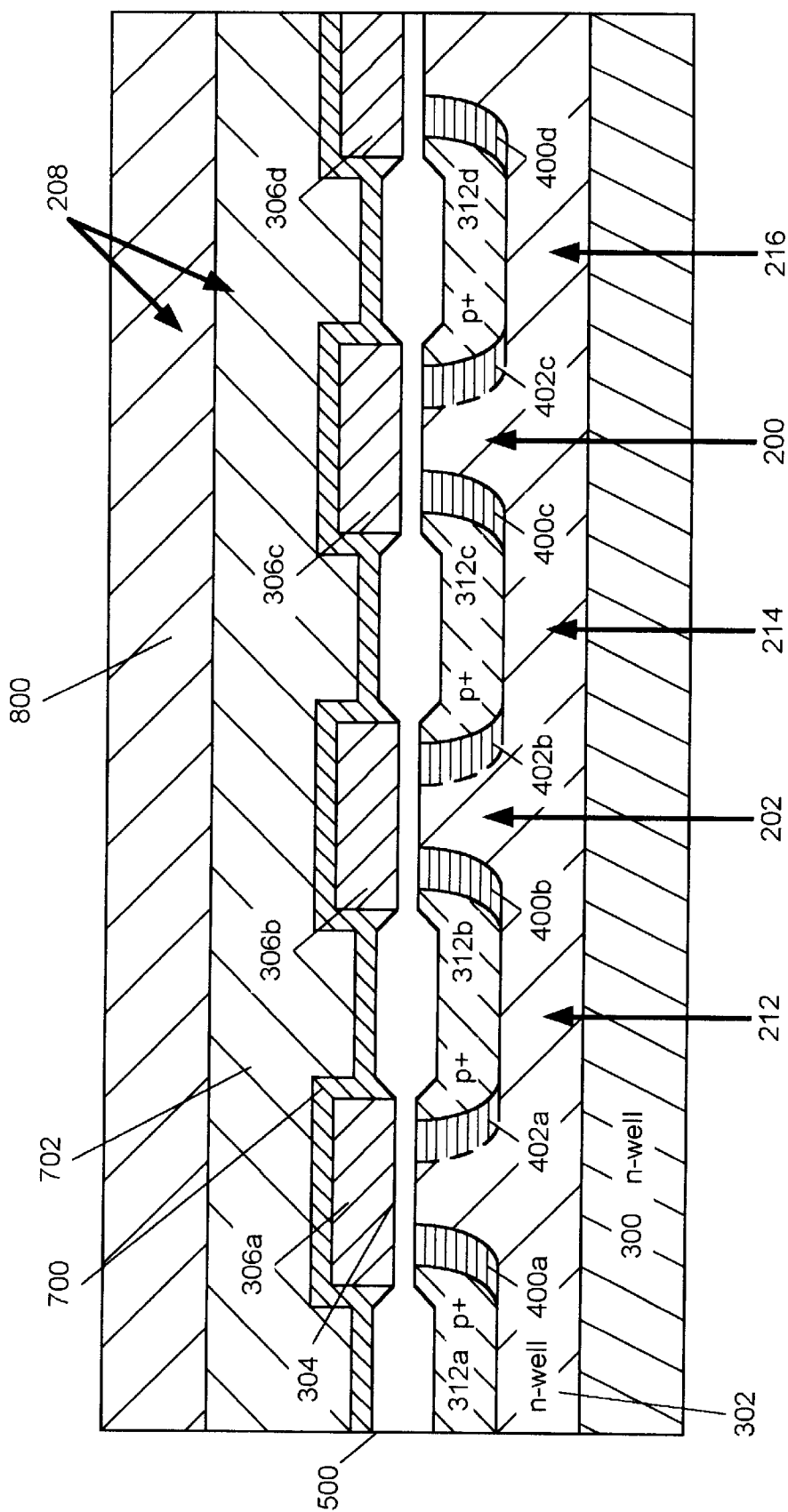

As shown in FIG. 8, the formation of the memory cells is completed. A silicide layer 800 is formed on polysilicon layer 702. Then the polysilicon and silicide layers are patterned masked and etched to form word-line 208 shown in FIG. 2. The silicide layer improves the conductivity of the word-line. Buried p$^+$ diffusion 312b, n$^-$ pocket 400b, and p$^-$ pocket 402a are connected to appropriate circuitry to form buried virtual ground bit-line 212. Buried p$^+$ diffusion 312c, n$^-$ pocket 402c, and p$^-$ pocket 400b are connected to appropriate decoding circuitry to form buried virtual ground bit-line 214. Buried p$^+$ diffusion 312d, n$^-$ pocket 400d and p$^-$ pocket 400c are connected to appropriate circuitry to form a buried virtual ground buried bit-line 216. Floating gate transistor 202, is thereby formed from control gate/word-line 208, floating gate core 306b and buried bit-lines 212 and 214. Floating gate transistor 200 is formed by control gate/word-line 208, floating gate core 306c and bit-lines 214 and 216.

As described above, according to the asymmetric p-channel transistor and manufacturing method therefor of this invention, memory cells can be fabricated with a high density, high programming speed and with reduced gate disturb.

The foregoing description of a preferred embodiment of the invention has been presented for purposes of illustration and description. It is not intended to limit the invention to the precise forms disclosed. Obviously many modifications and equivalent arrangements will be apparent to practitioners skilled in this art. Therefore, persons of ordinary skill in this field are to understand that all such equivalent structures are to be included within the scope of the following claims and their legal equivalents.

What is claimed is:

1. A floating gate cell, comprising:
   a semiconductor substrate characterized by a first conductivity type;
   a dielectric provided on the semiconductor substrate;
   a floating gate core provided on the dielectric and comprising first and second opposing sides;
   a first diffusion region and a second diffusion region in the semiconductor substrate aligned with the first and the second opposing sides of the floating gate core, respectively, and the first and second diffusion regions characterized by a second conductivity type opposite the first conductivity type;
   a third diffusion region in the semiconductor substrate on the first side of the floating gate core and extending toward the second side of the floating gate core, the third diffusion region characterized by an enhancement of the first conductivity type.

2. The floating gate cell of claim 1, further comprising;

a fourth diffusion region in the semiconductor substrate on the second side of the floating gate core and extending toward the first side of the floating gate core and characterized by a diminishment in the second conductivity type.

3. The floating gate cell of claim 2, further comprising;

a control gate dielectric and control gates on the floating gate core to provide a transistor.

4. The floating gate cell of claim 3, wherein;

said substrate is characterized by an n-type conductivity material;

said dielectric comprises silicon oxide;

said first diffusion region and said second diffusion region are characterized by a p-type conductivity material;

said third diffusion region is characterized by an n-type conductivity material having a greater conductivity than the substrate;

said fourth diffusion region is characterized by a p-type conductivity material having a conductivity less than the second diffusion region; and said floating gate core comprises polysilicon.

5. The floating gate cell of claim 1, wherein:

said substrate is characterized by an n-type conductivity material;

said dielectric comprises silicon oxide;

said first diffusion region and said second diffusion region are characterized by a p-type conductivity material;

said third diffusion region is characterized by an n-type conductivity material having a conductivity greater than the substrate; and said floating gate core comprises polysilicon.

6. A semiconductor memory array, comprising:

a semiconductor substrate characterized by a first conductivity type;

a dielectric on the semiconductor substrate;

an array of floating gates arranged in columns and rows provided on the dielectric;

a plurality of first diffusion regions in the semiconductor substrate between a first and a second column of the array of floating gate cores, and each of the plurality of first diffusion regions characterized by a second conductivity type;

a plurality of second diffusion regions in the semiconductor substrate each adjacent a corresponding one of the plurality of first diffusion regions and extending below the second column and each of the plurality of second diffusion regions characterized by an enhancement of the first conductivity type;

an isolation layer on the array of floating gate cores;

a plurality of word-line conductors on each of the rows of the array of floating gate cores, separated therefrom by the isolation layer, and forming a plurality of rows of floating gate transistors; and a plurality of select circuits having contact with the plurality of word-line conductors and the plurality of diffusion regions, wherein the plurality of select circuits selectively switch current to a word-line conductor and a selected pair of the first and second diffusion regions to program, erase, and read a selected floating gate transistor.

7. The semiconductor memory array of claim 6, further comprising;

a plurality of third diffusion regions in the semiconductor substrate each adjacent a corresponding one of the plurality of first diffusion regions and extending below the first column and each of the plurality of third diffusion regions characterized by a diminishment of the second conductivity type.

8. The semiconductor memory array of claim 7, wherein;

said substrate is characterized by an n-type conductivity material;

said dielectric comprises silicon oxide;

said plurality of first diffusion regions are characterized by a p-type conductivity material;

said plurality of second diffusion regions are characterized by an n-type conductivity material having a conductivity greater than the conductivity of the substrate;

said plurality of third diffusion regions are characterized by a p-type conductivity material having a conductivity less than the conductivity of the plurality of first diffusion regions; and said array of floating gate cores comprise polysilicon.

9. The semiconductor memory array of claim 6, wherein:

said substrate is characterized by an n-type conductivity material;

said dielectric comprises silicon oxide;

said plurality of first diffusion regions are characterized by a p-type conductivity material;

said plurality of second diffusion regions are characterized by an n-type conductivity material having a conductivity greater than the conductivity of the substrate; and said array of floating gate cores comprise polysilicon.

* * * * *